United States Patent [19]
Suzuki et al.

[11] 3,960,559
[45] June 1, 1976

[54] METHOD OF MAKING A SEMICONDUCTOR DEVICE UTILIZING A LIGHT-SENSITIVE ETCHING AGENT

[75] Inventors: Gyoji Suzuki; Masayoshi Nagata; Takeshi Tomotsu; Hisatake Ono, all of Asaka, Japan

[73] Assignee: Fuji Photo Film Co., Ltd., Minami-ashigara, Japan

[22] Filed: Oct. 16, 1973

[21] Appl. No.: 406,986

[30] Foreign Application Priority Data
Oct. 19, 1972    Japan.............................. 47-104751

[52] U.S. Cl. ........................................ 96/36; 156/4; 156/13; 156/17; 252/79.3
[51] Int. Cl.² ........................................ C09K 13/08
[58] Field of Search ........................... 156/4, 17, 13; 252/79.3; 96/36, 36.2, 114.1

[56]         References Cited
          UNITED STATES PATENTS
3,520,685    7/1970    Schaefer .................................. 156/4
3,520,686    7/1970    Kopczewski ........................... 96/36
3,529,963    9/1970    Marchese ............................ 96/114.1

Primary Examiner—William A. Powell
Assistant Examiner—Jerome W. Massie
Attorney, Agent, or Firm—Sughrue, Rothwell, Mion, Zinn & Macpeak

[57]              ABSTRACT

A light-sensitive etching agent comprising (a) a photodecomposable compound forming upon decomposition a material capable of etching a silicon compound containing film or capable of etching the film after reaction with another material, (b) a material capable of forming water upon exposure to light, (c) a binder and (d) a solvent, and a method of making a semiconductor device utilizing the light-sensitive etching agent.

14 Claims, No Drawings

METHOD OF MAKING A SEMICONDUCTOR DEVICE UTILIZING A LIGHT-SENSITIVE ETCHING AGENT

BACKGROUND OF THE INVENTION

1. Field of the Invention

This invention relates to a method of making a semiconductor device and a light-sensitive etching agent. More particularly, this invention is concerned with a method whereby a pattern for semiconductor elements is made using a semiconductor silicon substrate having a protective film.

2. Description of the Prior Art

It is well known in the fields of integrated circuits or semiconductors to make a pattern on a semiconductor substrate of a semiconductor element or on the protective film on the semiconductor substrate. The most commonly used method consists in forming a silicon dioxide film on a surface of silicon or germanium, applying thereto a light-sensitive material, for example, a light-sensitive polymer (a photoresist), irradiating and hardening the polymer through a photomask, removing the non-irradiated area, i.e., the non-hardened area, and thus exposing the surface of the silicon dioxide film to make a pattern. The exposed area is then treated with an etching solution for the silicon dioxide film to expose the silicon or germanium substrate. After removing the hardened photoresist, another metal is diffused to the exposed area of silicon or germanium.

The above described photographic technique is known as "photoetching" in general. The diffusion operation is repeatedly carried out depending on the kind of semiconductor element to be produced and correspondingly, the steps of coating of the light-sensitive material, irradiation, development, etching of the silicon dioxide, removing of the light-sensitive material on the non-irradiated area and diffusion must be repeated. Therefore, many hours and precise techniques are required and the hardened area is somewhat weakened in removing the non-hardened area.

Improvements relating to photoetching techniques have been disclosed in U.S. Pat. Nos. 3,095,332, 3,095,341, 3,122,463, 3,346,384, 3,471,291, 3,489,564, 3,494,786, and 3,520,684 – 7, and French Pat. No. 1,394,467. Based on these disclosures, a method of forming a pattern on a film of silicon dioxide on a silicon semiconductor substrate, such as silicon, will be illustrated. A silicon slice having a silicon dioxide film is contacted with an atmosphere of a composition that yields upon irradiation a substance capable of etching the silicon dioxide film with the irradiation being through a photomask having a suitable pattern to thus etch the silicon dioxide film and to form a corresponding pattern in depth. That is to say, the irradiation and etching are carried out at the same time. For example, a silicon slice having a silicon dioxide film is contacted with a gaseous atmosphere such as a fluorine compound capable of yielding fluorine upon irradiation with light, for example, $F_2O$, with the irradiation being through a photomask. Alternatively, such a silicon slice is contacted with a gaseous atmosphere of a fluorine compound, for example, fluorobenzene, cooled to form a liquid film of fluorobenzene on the silicon dioxide film and then irradiatd through a photomask. In other examples, a mixture of an organic fluorine compound and mineral acid is used as a liquid etching agent and a mixture of an organic fluorine compound, an organic solvent and polyvinyl alcohol, and optionally with a mineral acid, is used as a solid etchant.

In these methods, however, it is very difficult to effect the reaction of the silicon dioxide film with the fluorine, as a photodecomposition product, uniformly over the entire surface of a pattern in a short time since the fluorine is in a flowing condition and to reproduce the pattern precisily because the fluorine compound is continuously fed between the silicon dioxide film and the photomask when carrying out the contacting in a liquid or gaseous state.

In the formation of a liquid film, furthermore, there is the problem of the surface tension between the liquid and the silicon dioxide film and the problem of how to store the liquid film on the film of silicon dioxide, which will cause various difficulties when the surface is irradiated with light. In view of U.S. Pat. No. 3,494,768, for example, it is not easy to find a method for effecting cycling of the liquified non-exposed gas and the removal of the liquid film containing the fluorine reacted with the silicon dioxide film uniformly over the entire surface to be etched and to devise an apparatus for practicing the method. In addition, during irradiation, the gas and liquid flowing between the photomask and the silicon dioxide film interfere with the light path and the precision of the pattern is lowered greatly. In this system, therefore, it is difficult to increase the precision of a fine pattern required for an IC or a LSI.

We, the inventors, have already reported that a pattern of an oxide film having a thickness is formed in a shortened time by providing on a silicon substrate a single film of a silicon compound such as silicon oxide, silicon nitride, a borosilicate glass or a phosphosilicate glass, or a composite film of two of these materials, applying to the film a composition called a "light-sensitive etching agent" which is decomposed upon irradiation with light to form a material capable of etching the above described oxide film or nitride film with or without another material, drying to form a solid film and then irradiating the light-sensitive etching agent through a photomask having a particular pattern.

According to this method, a quite excellent pattern can be obtained in a short time in comparison with the prior art methods, but it is desirable to be able to produce a more precise pattern in an even shorter time.

It is an object of the invention to produce a semiconductor device having a protective film on a silicon substrate in a short time.

It is another object of the invention to provide a light-sensitive etching agent for prcducing a semiconductor device in a short time.

SUMMARY OF THE INVENTION

The above described objects can be accomplished by applying to a layer or a film containing silicon, e.g., a silicon compound, provided on a semiconductor substrate a light-sensitive etching agent comprising (a) a compound which is decomposed by light and forms a material per se capable of etching the film or forms a material which after reaction with another material capable of etching the film, (b) a material forming water upon irradiation with light, (c) a binder and (d) a solvent, and then subjecting the substrate so treated to imagewise irradiation to thereby etch the film containing silicon.

Furthermore, the above described objects can be accomplished using a light-sensitive etching agent comprising (a) a compound which is decomposed upon irradiation with light and forms a material per se capable of etching the film or which is capable of etching the film after being reacted with another material, (b) a material forming water upon irradiation with light, (c) a binder and (d) a solvent.

A feature of the invention is to incorporate the material forming water upon irradiation with light in a light-sensitive etching agent as one component.

DETAILED DESCRIPTION OF THE INVENTION

It is known from the disclosure of, for example, Japanese Pat. Publication 19529/71 that when a silicon dioxide film is coated with a fluorine-containing polymer, dried and irradiated with light in a high humidity atmosphere, an etching reaction takes place at the boundary between the silicon dioxide film and the polymer. According to this method, however, the etching reaction does not take place to an appreciable extent, and, at best, the hydrophobic silicon dioxide film is rendered hydrophilic only. The method and composition according to the instant invention are in some ways similar to the above described known technique, but superior particularly from the standpoint of etching speed and pattern resolution. It is not clear why such differences exist. Since water is necessary for the etching reaction and the etching material formed upon irradiation with light etches due to the water present in the layer, the etching material etches at the non-irradiated area and etches it in a high humidity atmosphere according to the prior art so that the moisture causes the non-imagewise irradiated areas to be etched. According to the invention, on the other hand, water is present only at the irradiated area when the etching reaction takes place, that is, the irradiation is carried out almost under dry conditions so that the etching material etches at the irradiated area only and the etching reaction is precisely completed. In the method of the invention, a sufficient amount of water present latently is formed upon irradiation with light and more water can be obtained by increasing the quantity of light, i.e., the quantity of irradiation used, than in the prior art employing a high humidity atmosphere. Moreover, a uniform quantity of water can be obtained in the thickness direction of the light-sensitive etching agent, so that the etching reaction is effected rapidly and precisely. According to the invention, the etching can be carried out more rapidly than in the prior art, since a photodecomposition accelerator for accelerating the photodecomposition reaction of a fluorine compound and an etching reaction accelerator for accelerating the etching reaction can also be contained, if desired, in the composition.

Illustrative materials capable of forming water under irradiation with light are the combination of N,N-dimethylnitrosoaniline and benzyl cyanide, the combination of an alcohol (including polyhydric alcohols) and aniline hydrobromide, nitromethane and methyl nitrite.

Other examples of the compounds which are capable of forming water upon irradiation with light are as follows:

Quinine derivatives such as quinine, quinine hydrochloride, quinine hydrobromide, or quinine bisulfite;

Carboxylic acid hydrates such as oxalic acid, flavianic acid, tetrachloronaphthalene dicarboxylic acid hydrate or hydroxypyruvic acid hydrate;

Sulfonic acid hydrates such as sulfobenzoic acid or nitronaphthalene sulfonic acid dihydrate;

Nitrogen compound hydrates such as piperadine, 4,4'-dipyridyl or hydrazine hydrate;

Aldehyde hydrates such as chloral hydrate or bromal hydrate; and the like. Of course, a feature of the invention is to use a material capable of forming water upon irradiation with light as one component, and this material is not limited to only these specific examples. The semiconductor substrate employed in this invention can be a substrate of silicon, germanium, gallium arsenide, gallium-arsenide-phosphide, gallium-phosphide, etc. Preferably, the semiconductor substrate is silicon.

The method of the invention will now be illustrated in accordance with the order of the processng steps employed:

As a substrate, the so-called N-type or P-type semiconductor silicon can be used, on which a protective film is formed using various methods. When the foregoing silicon substrate or slice is fired in the presence of oxygen or nitrogen, a film of silicon monoxide and/or silicon dioxide or silicon nitride is formed. A film of silicon dioxide can be obtained by the thermal decomposition of an organic silicon compound such as tetraethoxysilane. It is known that, in the case of using germanium as a semiconductor substrate, a silicon dioxide film is similary formed on the germanium slice using the thermal decomposition of tetraethoxysilane. A silicon nitride film is obtained by the gaseous phase growth using silicon tetraoxide or silicon tetrahydride. In addition, a borosilicate glass and a phosphosilicate glass can be used as a film containing silicon.

The above described film protects and stabilizes the surface silicon and, at the same time, acts, as a mask for the selective diffusion of donor or acceptor atoms. Moreover, it is convenient in making window areas for metal contacts during the production of the semiconductor element. Onto the so obtained silicon film on the substrate is coated the light-sensitive etching agent.

Examples of photodecomposable compounds which are able to etch the foregoing film, for example, silicon dioxide, or which are able after the reaction of this decomposition product with another material etch the foregoing film of, for example, silicon dioxide, are as follows:

1. compounds containing an iminosulfadifluoride group ($-N=SF_2$) such as phenyliminosulfadifluoride, $\alpha,\alpha$-difluorobenzyliminosulfadifluoride, 1,1,2,2-tetrafluoroethane-1,2-bis(iminosulfadifluoride), propyliminosulfadifluoride and tetrahydrofuran-3,4-bis(iminosulfadifluoride)

2. compounds containing a sulfapentafluoride group ($-SF_5$) and their derivatives such as phenylsulfapentafluoride, nitrophenylsulfapentafluoride, aminophenylsulfapentafluoride, aminophenylsulfapentafluoride hydrobromide, azidophenylsulfapentafluoride, phenylbis(sulfapentafluoride), naphthol azophenylsulfapentafluoride, aminophenylbis-(sulfapentafluoride) hydrobromide, bis-(sulfapentafluoride)azobenzene, di-perfluoroethylsulfatetrafluoride, perfluorothioxane tetrafluoride, phenylsulfachloride tetrafluoride, n-butylsulfachloride tetrafluoride, 1-chloroethane-1,2-bis(sulfapentafluoride), ((di-chloroethanediylidene)dinitro)-bis(sulfapentafluoride), pentafluorosulfoxybenzene, 3-pentafluorosulfapyrazole, and perfluorotetradecane-1,14-bis(pentafluorosulfaoxide)

3. compounds containing a sulfonylfluoride group ($-SO_2F$) such as benzenesulfonyl fluoride, sulfanilyl fluoride, isocyanatobenzenesulfonyl fluoride, methanesulfonyl fluoride, perfluorohexane-1,6-bis(sulfonylfluoride) and fluorosulfonylbenesulfonyl fluoride 4. halogenated benzenes and their derivatives having the general formula

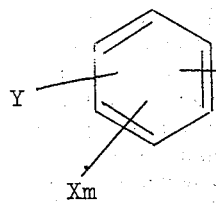

wherein X and Y, which may be the same or different, each is a hydrogen atom, a halogen atom, an alkyl group or an unhalogenated aryl group or aryl sulfonyl group, and m and n integers, such as 1,2-dibromotetrafluorobenzene, pentafluoroiodobenzene, hexafluorobenzene, fluorobenzene and p,p'-difluorodiphenyl sulfone 5. polyfluorobiphenyls and their derivatives having the general formula

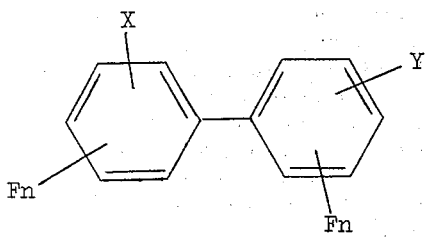

wherein X and Y, which may be the same or different, each is a hydrogen atom, a mercapto group, a sulfonic group, a hydroxyl group or a halogen atom, and m and n are integers, such as octafluorobiphenyl, and 4,4'-dimercaptoperfluorobiphenyl 6. α,α,α-trifluorotoluenes and derivatives thereof having the general formula

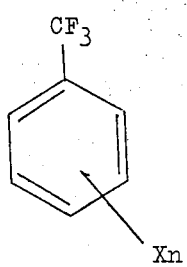

wherein X in the above general formula is a hydrogen atom, a hydroxyl group, a carboxyl group, an acetyl group, a nitro group or a halogen atom, and n is an integer, such as α,α,α-trifluorotoluene, m-bromo-α,α,α-trifluorotoluene, nitroα,α,α-trifluorotoluene, 3,5-di-(trifluoromethyl)phenol, α,α,α-trifluorocresol, trifluoromethylbenzoic acid and trifluoromethylbenzoic acid methyl ester 7. trifluoromethylnaphthols and their derivatives having the general formula

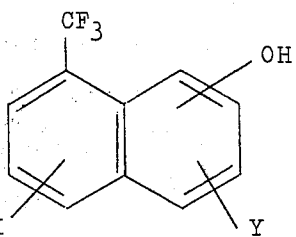

wherein X and Y, which may be the some or different, each is a hydrogen atom, a hydroxyl group or a sulfonic group, and m and n are integers, such as trifluoromethylnaphthol, trifluoromethyl naphthol sulfonic acid, and trifluoromethyl naphthol disulfonic acid 8. fluorourasil, dimethylfluorourasil and 5-trifluoromethyl 2,6-dioxypyrimidine and their derivatives having the general formula

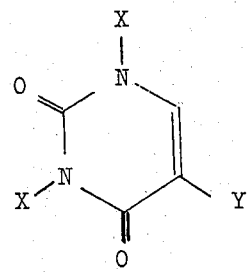

wherein X is a hydrogen atom or a methyl group, and Y is a fluorine atom or a trifluoromethyl ($CF_3$), 9. copolymers of tetrafluoroethylene and perfluoronitrosoalkanes such as perfluoro-2-methyl-1,2-oxazetydine, perfluoro-2-ethyl-1,2-oxazetydine and perfluoro-2-n-propyl-1,2-oxazetydine having therein repeating units of the formula

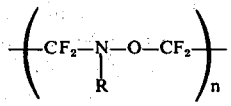

wherein R is an alkyl group such as methyl or ethyl, with the molecular weight of the polymer being about 7,000 to 10,000, 10. compounds containing a ketone group and a fluorine atom such as monofluoroacetone, 4,4'-fluorobenzophenone and fluoranyl 11. compounds Synthesized from compounds containing a difluoroamino group (—$NF_2$) and such as trityldifluoroamine, α,β-bis(difluoroamino)perfluoropropyl-ethyl ether, α-difluoroaminoperfluoropropionyl fluoride, α-difluoroaminofluorimine, 3-difluoroamino-2-fluoro-2-azacyclohexanone, 1,1,2-tris(difluoroamino)-3,5-cyclohexadiene and tetrafluorohydrazine 12. perfluoro(alkylene-alkylamines) and their derivatives having the general formula

RN=CFX wherein X is a fluorine atom or a perfluoroalkyl group, and R is a perfluoroalkyl group, such as perfluoro(-methylene-n-propylamine), perfluoro(methylene-n-butylamine) and perfluoro(ethylene-n-butylamine)

13. halogenated hydrocarbons (of the formula R-F, wherein R is a halogenated alkyl group) such as trifluoroiodomethane, difluorodichloropropane, difluorodibromopropane and tetrafluorodibromopropane 14. fluorinated alcohols (of the formula R—OH, wherein R is a fluorinated alkyl group) such as 1-fluoro-2-propanol, perfluoropentanol, perfluoro-tert-butyl alcohol, perfluoropinacol and bis(perfluoro-isopropyl)carbinol 15. fluorophosphoranes ($-PF_4$) such as phenyltetrafluorophosphorane, diphenyltrifluorophosphorane, triphenyldifluorophosphorane and diethyltrifluorophosphorane 16. phosphoryl fluoride derivatives ($-PO_2F_2$) such as difluorophosphoric acid anhydride and polyphosphoryl fluoride The foregoing two components are dissolved in a solvent with a binder for coating onto the film. The binder and solvent must not affect the film, but any kind of binders and solvent can be used in fact so long as the binders and the solvent are inert to both the film and the other components present in the light sensitive etching agent composition. The proportions of the components in the light-sensitive etching agent are not limited particularly and are preferably so blended that the amount fluorine be 0.1% by weight or more assuming that 100% of the foregoing compound (a) is decomposed, and that water be 0.5% by weight or more assuming that water is formed from the foregoing material (b) in a yield of 100%. To achieve the above the amount of photodecomposable compound which can be employed in the composition of this invention is more than 0.05 wt%, preferably 0.1~5 at %, and the amount of the material capable of forming water which can be employed in the composition of this invention is more than 0.1 wt%, preferably 0.5 to 1 wt%. The amounts of the binder and solvent can be determined easily by those skilled in the art.

Examples of suitable binders are natural high molecular weight compounds such as gelatin and casein, polyvinyl resins such as polyvinyl pyrrolidone, polyvinyl acetophenone, polyvinyl alcohol, polyvinyl acetate and polyvinyl butyral, polystyrene resins such as poly(2-fluorostyrene), poly(4-bromostyrene) and polyacrylate resins such as polymethyl acrylate, polyethyl acrylate, polymethacrylic acid and polymethyl methacrylate, styrene type copolymers such as styrene-maleic anhydride copolymers and styrene-vinyl pyrrolidone copolymers and high molecular weight compounds such as low polymerization formaldehyde resins and polyamides. A suitable molecular weight for the binders is a molecular weight of more than about 800, preferably about 1500 to 1,000,000, more preferably 3000 to 500,000. Since the polymer materials basically act as a binder, varying ratios of monomer materials in the copolymers can be employed.

Examples of suitable solvents are aliphatic hydrocarbons such as n-hexane, aromatic hydrocarbons such as benzene, toluene and xylene, alicyclic hydrocarbons such as cyclohexane petroleum ethers, ketones such as acetone and methyl ethyl ketone, alcohols such as methyl alcohol, ethyl alcohol and n-butyl alcohol, ketoalcohols such as diacetone alcohol, esters such as methyl acetate and ethyl acetate, ethers such as diethyl ether, ethyl propyl ether and tetrahydrofuran, and carbon disulfide. The properties of the solvent used are not limited particularly, but solvents having relatively low boiling points are preferable to facilitate drying.

To the light-sensitive etching agent of the invention can optionally be added a photodecomposition accelerator, for example, the halogenated benzenes such as bromobenzene, iodobenzene and p-nitroiodobenzene, hydrocarbons containing a sulfonyl chloride group such as trichloromethanesulfenyl chloride and trichloromethanesulfonyl chloride, aldehydes such as formaldehyde, acetaldehyde, benzaldehyde and phenylacetaldehyde and ketone compounds such as acetophenone, benzophenone, bromoethyl methyl ketone and $\omega$-bromoacetophenone. The photodecomposition accelerator can readily be chosen from known compounds that become reactive upon irradiation with light.

An etching reaction acelerator can also be added to the composition. The etching reaction accelerator can generally be an acid material and, in particular, an organic acid can be practically used. Examples of etching reaction accelerators are carboxylic acids such as acetic acid, propionic acid, isobutyric acid, oxalic acid, malonic acid, succinic acid and dimethylmalonic acid, haloacids such as fluoroacetic acid, trifluoroacetic acid, dichloroacetic acid and $\alpha$-fluoropropionic acid, sulfonic acids such as 1,2-ethanedisulfonic acid, trifluoromethanesulfonic acid and trichloromethanesulfonic acid, peroxides such as peracetic acid, perbenzoic acid, hydrogen peroxide and ammonium persulfate, and mineral acids such as hydrochloric acid, sulfuric acid, nitric acid, phosphoric acid and polyphosphoric acid. Some of these compounds, for example, the peroxides, have also the characteristics of being a photodecomposition accelerator and, therefore, can be used advantageously.

The amount of the photodecomposition accelerator and the etching reaction accelerator when used can range from about 5 to 50% by weight, preferably 10 to 40% by weight and about 1 to 30% by weight, preferably 3 to 25% by weight, respectively, to the weight of component (a).

The necessary and essential components of the composition of the invention are components (a), (b), (c) and (d) as hereinbefore described. However, some compounds for these components can have a dual functionality in the composition, for example, some compounds both have a photodecomposable property (a) and a binding property (c), such as a copolymer of tetrafluoroethylene and perfluoronitrosoalkane (molecular weight; about 7,000 to 10,000) or poly(pentafluorosulfo)styrene (molecular weight; about 2,000). Such a component can serve the functions of both component (a) and component (c) simultaneously. Similarly, some compounds have a photodecomposable property (a) and are also a solvent (d). Examples of such compounds are polyhalogenated benzene, trifluorotoluene (or derivatives thereof) or fluorinated alcohols, and such compounds can serve the functions of both components (a) and (d). Accordingly, in this case, while the function of components (a), (b), (c) and (d) must necessarily be provided, it may be unnecessary to use the four individual compounds to achieve the functions of components (a), (b), (c) and (d).

Coating of the light-sensitive etching agent can be carried out in the dark using conventional techniques, for example, a dip method or a spinner method, and the coated film is then dried. The thus resulting light-sensitive etching agent layer is exposed via a photomask using a source of radiation such as a mercury lamp, a xenon lamp, a tungsten lamp, electron beam or laser ray. A wave length of light of about 300 to 500 m$\mu$ can be suitably employed. For example, it is desirable that a suitable exposure is preferably within 3 minutes under irradiation with a 100 W high pressure mercury lamp. The light-sensitive etching agent on the area exposed to the radiation decomposes and yields an etching material as well as water. Thus, the decomposed product etches the film in the presence of water. Since the quantity of water formed is very small and the decomposition and formation of water proceed continuously, it is difficult to detect it with the naked eye.

Where the reaction product of the photodecomposition product with another material etches the foregoing film, for example, where a light-sensitive etching agent comprising trityldifluoroamine as the fluorine compound, polystyrene as the binder and benzene as the solvent is used, using this light-sensitive etching agent, fluoride ions are released from the trityldifluoroamine upon irradiation with light and react with hydrogen ions from the sytrene to form fluoride, which etches the film. The non-irradiated light-sensitive etching agent and reaction product of the decomposition product with the oxide film are removed with water or an organic solvent and the silicon substrate is exposed at the area irradiated. Suitable organic solvents which can be employed to remove the excess light sensitive etching agent and the reaction products produced after exposure are aromatic hydrocarbons such as toluene or xylene; ketones such as acetone or methylethylketone; ethers such as tetrahydrofuran, dioxane, methylcellosolve or ethylcellosolve; alcohols such as methyl alcohol or ethyl alcohol; water and mixtures thereof.

As is apparent from the foregoing illustration, a pattern for a semiconductor element with a protective film can be formed rapidly on a silicon substrate in a simple manner using the light-sensitive etching agent according to the invention. A pattern necessary for integrated circuits and transistors can thus be attained. In the prior art method, the time for etching a silicon dioxide film is 15 to 60 minutes with a light source of 1 KW, while in the case of using the light-sensitive etching agent of the invention, the same silicon dioxide film can be etched in about 1 minute using a light source of 100 W. That is to say, the instant invention is markedly superior to the prior art methods, in particular, with respect to the etching time and the number of processing steps recurred and, therefore, the invention can be advantageously adapted to the production of semiconductor elements.

The following examples are given to illustrate the invention in greater detail without limiting the same. Unless otherwise indicated, all parts and percents are by weight.

EXAMPLE 1

A light-sensitive etching agent comprising 6 g of $\alpha,\alpha,\alpha$-trifluorocresol as the fluorine compound in which the material per se formed by the photodecomposition etches a silicon dioxide film, 6 g of polyvinyl butyral with a molecular weight of about 10,000 as a binder, 1 g of bromobenzene as a photodecomposition accelerator, 0.5 g of 30% peracetic acid as an etching reaction accelerator, 6 g of nitrosodimethylaniline and 4.7 g of benzyl cyanide as a material capable of forming water upon irradiation with light and 10 g of acetone as a solvent was coated using a spinning technique at 4,000 rpm onto the surface of a silicon dioxide film of a thickness of 5,000 A on a silicon slice 30 mm in diameter and held at 40°C for 15 minutes thus to obtain a dried film of a light-sensitive etching agent layer having a thickness of 30 microns. Then the coated slice was brought into close contact with a photomask having a suitable pattern, irradiated with radiation from a high voltage 100 W mercury lamp and the silicon dioxide film in the transparent pattern area of the photomask could be etched completely in only 60 seconds. Thereafter, the slice was treated with an organic solvent to remove the excess light-sensitive etching agent and the reaction product of the light-sensitive etching agent with the silicon dioxide and to give an aperture for the diffusion of impurities into the silicon slice.

EXAMPLE 2

A light-sensitive etching agent comprising 3 g of 1,2-dibromotetrafluorobenzene as a fluorine compound, 3 g of polystyrene with a molecular weight of about 20,000 as a binder, 3 g of acetone as a solvent, 1 g of p-nitroiodobenzene as a photodecomposition accelerator, 0.5 g of 30% peracetic acid as an etching reaction accelerator and 3 g of nitromethane as a material capable of forming water upon irradiation with light was coated using a spinning technique at 4,000 rpm onto the surface of a silicon dioxide film of a thickness of 5,000 A on a silicon slice 30 mm in diameter and held at 40°C for 15 minutes thus to obtain a dried film of a light-sensitive etching agent layer having a thickness of 20 microns. Thereafter, the coated slice was subjected to irradiation and treatment with an organic solvent in the similar manner to that described in Example 1 to give an aperture for the diffusion of impurities into the silicon slice. The exposure time was only 60 seconds.

EXAMPLE 3

A light-sensitive etching agent comprising 5 g of phenylsulfapentafluoride as a fluorine compound, 3 g of polyvinylpyrrolidone with a molecular weight of about 20,000 as a binder, 5 g of acetone as a solvent, 1 g of bromobenzene as a photodecomposition accelerator, 0.5 g of 85% peracetic acid as an etching reaction accelerator and 3 g of diphenyl pinacol and 0.5 g of aniline hydrobromide as a material capable of forming water upon irradiation with light was coated using a spinning technique at 4,000 rpm onto the surface of double films of silicon dioxide of a thickness of 3,000 A and silicon nitride of a thickness of 1,000 A and held at 30°C for 15 minutes thus to obtain a dried film of a light-sensitive etching agent layer having a thickness of 30 microns. Then the coated slice was brought into close contact with a photomask having a suitable pattern, irradiated with radiation from a high voltage 100 W mercury lamp and the double films of silicon dioxide and silicon nitride in the transparent pattern areas of the photomask were completely etched. Thereafter, the slice was treated with an organic solvent to remove the excess light-sensitive etching agent and the reaction product of the light-sensitive etching agent with the double films and to give an aperture for the diffusion of impurities.

While the invention has been described in detail and with reference to specific embodiments thereof, it will be apparent to one skilled in the art that various changes and modifications can be made therein without departing from the spirit and scope thereof.

What is claimed is:

1. A method of making a semiconductor device, which comprises
applying to a silicon containing film provided on a semiconductor substrate a light-sensitive etching agent comprising (a) a photodecomposable compound forming upon decomposition a material capable of etching said film in presence of water, (b) a material capable of forming water upon irradiation with light, (c) a binder inert to compounds (a), (b) and (d) and (d) a solvent inert to components (a) and (b), and then image-wise exposing said light sensitive etching agent to irradiation capable of decomposing said photodecomposable compound and said material capable of forming water to thereby selectively said film.

2. The method of making a semiconductor device of claim 1, wherein said photodecomposable compound is a compound containing an iminosulfadifluoride group, a compound containing a sulfonyl fluoride group, a fluorobenzene, a polyfluorobiphenyl, $\alpha,\alpha,\alpha$-trifluorotoluene, a trifluoromethylnaphthol, a fluorouracil, a copolymer of tetrafluoroethylene and perfluoronitrosoalkane, a compound containing a ketone group and a fluorine atom, a compound containing a difluoroamino group, tetrafluorohydrazine, a perfluoro(alkylene-alkylamine), a halogenated fluoroalkane, a fluorinated alcohol, a fluorophosphorane, a phosphoryl fluoride and a compound containing a sulfapentafluoride group.

3. The method of making a semiconductor device of claim 1, wherein said material capable of forming water is the combination of N,N-dimethylnitrosoaniline and benzyl cyanide, the combination of an alcohol and aniline hydrobromide, nitromethane, methylnitrite, a quinine derivative, a carboxylic acid hydrate, a sulfonic acid hydrate, a nitrogen-compound hydrate or an aldehyde hydrate.

4. The method of making a semiconductor device of claim 1, wherein said solvent is an aliphatic hydrocarbon, an aromatic hydrocarbon, an alicyclic hydrocarbon, a ketone, an alcohol, a ketoalcohol, an ester, an ether, or carbon disulfide.

5. The method of making a semiconductor device of claim 1, wherein said photodecomposable compound is present in said etching agent in an amount so as to provide upon decomposition an amount of fluorine of 0.1% by weight and wherein said material capable of forming water is present in said etching agent in an amount so as to provide 0.5% by weight water upon decomposition.

6. The method of making a semiconductor device of claim 1, wherein said semiconductor substrate is silicon, germanium, gallium arsenide, gallium-arsenide-phosphide, or gallium phosphide and said silicon containing film provided on said substrate is silicon dioxide, silicon monoxide, silicon nitride, a borosilicate glass or a phosphosilicate glass.

7. The method of making a semiconductor device of claim 1, wherein said light-sensitive etching agent contains a photodecomposition accelerator and an etching reaction accelerator.

8. The method of making a semiconductor device of claim 7, wherein said photodecomposition accelerator is a halogenated benzene, a hydrocarbon containing a sulfonyl chloride group, an aldehyde or a ketone and wherein said etching reaction accelerator is a carboxylic acid, a halocarboxylic acid an organic sulfonic acid, a peroxide, a persulfate, or a mineral acid.

9. The method of making a semiconductor device of claim 1 wherein said binder has a molecular weight greater than about 800 up to about 1,000,000.

10. The method of making a semiconductor device of claim 9 wherein said binder is gelatin or casein.

11. The method of making a semiconductor device of claim 9 wherein said binder is a polyvinyl resin.

12. The method of making a semiconductor device of claim 9 wherein said binder is a polyacrylate resin.

13. The method of making a semiconductor device of claim 9 wherein said binder is a styrene copolymer.

14. The method of making a semiconductor device of claim 9 wherein said binder is a formaldehyde resin.

* * * * *